(12) United States Patent
Le Vaillant et al.

(10) Patent No.: US 9,240,343 B2
(45) Date of Patent: Jan. 19, 2016

(54) METHOD FOR MODIFYING AN INITIAL STRESS STATE OF AN ACTIVE LAYER TO A FINAL STRESS STATE

(71) Applicant: Soitec, Crolles Cedex (FR)

(72) Inventors: Yves-Matthieu Le Vaillant, Crolles (FR); Etienne Navarro, Grenoble (FR)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 14/438,175

(22) PCT Filed: Oct. 11, 2013

(86) PCT No.: PCT/IB2013/002292
§ 371 (c)(1),
(2) Date: Apr. 23, 2015

(87) PCT Pub. No.: WO2014/068377
PCT Pub. Date: May 8, 2014

(65) Prior Publication Data
US 2015/0249033 A1 Sep. 3, 2015

(30) Foreign Application Priority Data
Oct. 31, 2012 (FR) ...................................... 12 02939

(51) Int. Cl.
*H01L 21/46* (2006.01)
*H01L 21/30* (2006.01)
(Continued)

(52) U.S. Cl.
CPC ...... *H01L 21/76251* (2013.01); *H01L 21/2007* (2013.01); *H01L 23/5387* (2013.01);
(Continued)

(58) Field of Classification Search
CPC ..................... H01L 21/76251; H01L 23/5387; H01L 29/0657; H01L 21/2007

USPC .................................................. 438/457, 455
See application file for complete search history.

(56) References Cited

U.S. PATENT DOCUMENTS 7,427,554 B2 * 9/2008 Henley ............. H01L 21/76251
257/18
7,550,052 B2 * 6/2009 Fournel ................ H01L 21/187
148/DIG. 12

(Continued)

OTHER PUBLICATIONS

International Search Report for International Application No. PCT/IB2013/002292 dated Jan. 20, 2015, 2 pages.

(Continued)

*Primary Examiner* — Luan C Thai
(74) *Attorney, Agent, or Firm* — TraskBritt

(57) ABSTRACT

This process comprises steps of: a) providing a first substrate comprising the active layer made of a first material of Young's modulus $E_1$ and of thickness $h_1$; b) providing a second substrate made of a second material of Young's modulus $E_2$ and of thickness $h_2$; c) bending the first substrate and the second substrate such that they each have a curved shape of a radius of curvature R; d) joining the second substrate to the active layer such that the second substrate closely follows the shape of the first substrate; and e) re-establishing the initial at-rest shape of the second substrate, the process being noteworthy in that the second material of the second substrate is a flexible material respecting the relationship $E_2/E_1 < 10^{-2}$, in that the thickness of the second substrate respects the relationship $h_2/h_1 \geq 10^4$, and in that the radius of curvature respects the relationship $$R = \frac{h_2}{2\varepsilon}.$$

22 Claims, 4 Drawing Sheets

(51) Int. Cl.
- *H01L 21/762* (2006.01)
- *H01L 21/20* (2006.01)
- *H01L 23/538* (2006.01)
- *H01L 29/06* (2006.01)
- *H01L 41/053* (2006.01)
- *H01L 41/187* (2006.01)
- *H01L 41/33* (2013.01)

(52) U.S. Cl.
CPC ........ *H01L29/0657* (2013.01); *H01L 29/0692* (2013.01); *H01L 41/053* (2013.01); *H01L 41/187* (2013.01); *H01L 41/33* (2013.01)

(56) References Cited

U.S. PATENT DOCUMENTS

2006/0141742 A1   6/2006   Fournel et al.
2007/0037323 A1   2/2007   Henley et al.

OTHER PUBLICATIONS

Turner, K.T., Fabricating Strained Silicon Substrates Using Mechanical Deformation During Wafer Bonding, ECS Transactions, vol. 16, No. 8, (2008), pp. 321-328.

* cited by examiner

METHOD FOR MODIFYING AN INITIAL STRESS STATE OF AN ACTIVE LAYER TO A FINAL STRESS STATE

CROSS-REFERENCE TO RELATED APPLICATIONS

This application is a national phase entry under 35 U.S.C. §371 of International Patent Application PCT/IB2013/002292, filed Oct. 11, 2013, designating the United States of America and published as International Patent Publication WO 2014/068377 A1 on May 8, 2014, which claims the benefit under Article 8 of the Patent Cooperation Treaty and under 35 U.S.C. §119(e) to French Patent Application Serial No. 1202939, filed Oct. 31, 2012, the disclosure of each of which is hereby incorporated herein in its entirety by this reference.

TECHNICAL FIELD

The present invention relates to a process for modifying an initial strain state of what is referred to as an active layer to a final strain state, and to a structure for modifying an initial strain state of an active layer to a final strain state.

BACKGROUND

The expression "active layer" is understood to mean a layer (or a plurality of sublayers) on which or in which components intended especially for applications in the fields of microelectronics, optics, optoelectronics, piezoelectricity or even spintronics will be fabricated.

The expression "strain state" is understood to mean the strains resulting from internal stresses between deformed portions of the useful layer, the internal stresses possibly being tensile or compressive stresses. When the internal stresses are zero or almost zero, a "relaxed state" is spoken of to designate the corresponding strain state.

An active layer made of a semiconductor is placed under (tensile or compressive) strain especially in order to modify its electronic band structure. This has the consequence of modifying its electron transport properties or its electromagnetic properties. From the electronic point of view, carrier mobility may be improved. From the electromagnetic point of view, the modification of the strain state leads to a modification of the valence and conduction bands and possibly of the (direct or indirect) bandgap of semiconductors and insulators.

To improve component performance, an active layer with a high strain level is required, meaning that an active layer must be able to undergo a substantial deformation (or in other words, a substantial relative extension). Thus, more precisely, it is sought to obtain an active layer that can be deformed by more than 0.75%, or even more than 1%, without creating defects.

The document entitled "*Fabricating Strained Silicon Substrates Using Mechanical Deformation during Wafer Bonding*," K. T. Turner, ECS Transactions, 16(8) 321-328 (2008), denoted D1 below, discloses (see FIG. 2 especially) a process for modifying an initial strain state of an active layer to a final strain state, the process comprising steps of a) providing a first substrate comprising the active layer in the initial strain state, the active layer being made of a first material having a Young's modulus denoted $E_1$, the active layer having a thickness denoted $h_1$; b) providing a second substrate made of a second material having a Young's modulus denoted $E_2$, the second substrate having a thickness denoted $h_2$, the second substrate having an initial shape at rest; c) bending the first substrate and the second substrate so that they each have a curved shape of substantially identical radius of curvature denoted R; d) joining the second substrate to the active layer so that the second substrate closely follows the shape of the first substrate; and e) re-establishing the initial at-rest shape of the second substrate so that the active layer has the final strain state.

D1 discloses (compare FIGS. 4(a) and 4(b) and see the first paragraph on page 327) that it is preferable to use a second substrate with a second material regarding the relationship $E_2 = E_1$ (i.e., $E_2/E_1 = 1/\Sigma = 1$ following the notations of D1) for a given thickness ratio $h_2/h_1$ ($h_2/h_1 = 1/\xi = 10^3$). D1 teaches that such a second substrate, in conjugation with the decrease in the thickness of the first substrate after the joining step d), allows the active layer to be substantially deformed and, therefore, high strains to be obtained therein. A contrario, D1 teaches that the flexibility of the second substrate ($\Sigma = 100$) relative to the first substrate, in conjugation with the decrease in the thickness of the first substrate after the joining step d), only leads to 70% of the value of the strains obtained for $\Sigma = 1$, for the same given thickness ratio $h_2/h_1$, ($h_2/h_1 = 1/\xi = 10^3$).

The process described in D1 is not entirely satisfactory when the first substrate has a substantial stiffness; for example, if the first substrate is made of a first semiconductor, such as silicon, then the second substrate also has a substantial stiffness so as to relate to $\Sigma = 1$. Such a second substrate may then be difficult to bend in step c) without creating defects if it is desired to deform the active layer by more than 0.75%, this especially being the case when the second substrate is of substantial size (for example, $h_2/h_1 = 1/\xi = 10^3$).

BRIEF SUMMARY

The present disclosure aims to remedy the aforementioned drawback, and relates to a process for modifying an initial strain state of what is referred to as an active layer to a final strain state denoted $\epsilon$, the process comprising steps of a) providing a first substrate comprising the active layer in the initial strain state, the active layer being made of a first material having a Young's modulus denoted $E_1$, the active layer having a thickness denoted $h_1$; b) providing a second substrate made of a second material having a Young's modulus denoted $E_2$, the second substrate having a thickness denoted $h_2$, the second substrate having an initial shape at rest; c) bending the first substrate and the second substrate so that they each have a curved shape of substantially identical radius of curvature denoted R; d) joining the second substrate to the active layer so that the second substrate closely follows the shape of the first substrate; and e) re-establishing the initial at-rest shape of the second substrate so that the active layer has the final strain state, the process being noteworthy in that the second material of the second substrate is a flexible material respecting the relationship $E_2/E_1 < 10^{-2}$, in that the thickness of the second substrate respects the relationship $h_2/h_1 \geq 10^4$, and in that the radius of curvature respects the relationship $$R = \frac{h_2}{2\epsilon}.$$

Thus, it was observed that surprisingly the thickness of the second substrate plays a more important role than its stiffness as regards increasing the torsional moment in step c). It is for this reason that the thickness of the second substrate is chosen to respect the relationship $h_2/h_1 \geq 10^4$. The second substrate must then permit a preset curvature to be obtained for such a thickness. It is for this reason that the second material is chosen to be a flexible material respecting the relationship $E_2/E_1 < 10^{-2}$. The curvature is preset according to the relationship $$R = \frac{h_2}{2\varepsilon},$$

the final strain state $\varepsilon$ being characterized by the desired strain level (and, therefore, the desired deformation).

Moreover, it will be noted that the order of steps c) and d) may be reversed. When step d) is carried out before step c), step c) then consists in simultaneously bending the first substrate and the second substrate so that they each have a curved shape of substantially identical radius of curvature denoted R. When step d) is carried out after step c), step c) then consists in separately bending the first substrate and the second substrate so that they each have a curved shape of substantially identical radius of curvature denoted R. Step d) then consists in joining the second substrate to the active layer so that the second substrate closely follows the curved shape of the first substrate.

When the initial strain state is a tensile strain state, a relaxed final strain state (i.e., $\varepsilon = 0$) is obtained in step c) when it is carried out so that the radius of curvature is negative, i.e., so that the free surface of the active layer is concave.

When the initial strain state is a compressive strain state, a relaxed final strain state is obtained in step c) when it is carried out so that the radius of curvature is positive, i.e., so that the free surface of the active layer is convex.

When the initial strain state is a relaxed state, a tensile final strain state is obtained in step c) when it is carried out so that the radius of curvature is positive, i.e., so that the free surface of the active layer is convex.

When the initial strain state is a relaxed state, a compressive final strain state is obtained in step c) when it is carried out so that the radius of curvature is negative, i.e., so that the free surface of the active layer is concave. However, this passage may be accompanied by buckling of the active layer if the strain level is too high.

According to one method of implementation, the first substrate comprises a first portion forming the active layer and a second portion, and the process comprises a step d1) consisting in decreasing the thickness of the second portion of the first substrate.

According to one embodiment, step d1) is carried out so that the first substrate remains self-supporting, step d1) being carried out before step c).

Thus, such a self-supporting first substrate makes it possible both to permit a substantial curvature to be obtained in step c) and to make it easier to transfer the active layer to the second substrate.

According to one variant embodiment, step d1) is carried out so as to remove substantially the entirety of the second portion of the first substrate, step d1) being carried out after step d) and before step e).

Thus, the energy associated with the strain level is concentrated in the active layer.

Advantageously, the second substrate comprises two lateral end portions, and the process comprises a step c1) consisting in arranging at least one reinforcing member in each lateral end portion, each reinforcing member preferably being needle-shaped.

Edge effects have been observed (illustrated in FIG. 2A), i.e., losses of effectiveness in terms of strain level in the lateral end portions of the active layer. Thus, such a step c1) allows this problem to be solved by locally reinforcing the lateral end portions of the second substrate. Moreover, a needle shape is particularly suitable for obtaining a mechanical reinforcement while ensuring the second material of the second substrate remains highly flexible.

Advantageously, the process comprises a step c2) consisting in joining a layer forming a stiffener to the second substrate, step c2) being carried out before step c).

Thus, the second substrate in conjugation with the layer forming a stiffener defines a composite substrate allowing a high strain level to be obtained without creating defects, even when the active layer has a large thickness $h_1$. The layer forming a stiffener acts as a counter plate that allows the deformation of the useful layer to be compensated for.

According to one embodiment, each reinforcing member extends from the layer forming a stiffener.

Thus, it is easy to place the reinforcing members in the second substrate using the layer forming a stiffener.

Preferably, the second material of the second substrate respects the relationship $E_2/E_1 < 10^{-3}$, and the thickness of the second substrate respects the relationship $h_2/h_1 < 10^5$.

Again preferably, the second material of the second substrate respects the relationship $E_2/E_1 \leq 10^{-4}$, and the thickness of the second substrate respects the relationship $h_2/h_1 \geq 10^6$.

Thus, ensuring these mathematical relationships are respected allows high strain levels to be obtained in the active layer without creating defects since the increase in the thickness of the second substrate relative to the first substrate is conjugated with an increase in the flexibility of the second substrate relative to the first substrate.

According to one embodiment, the thickness of the active layer is comprised between 5 nm and 50 nm and preferably between 5 nm and 35 nm, and the thickness of the second substrate is comprised between 1 cm and 10 cm.

According to one embodiment, the radius of curvature is comprised between 0.5 m and 2 m in absolute value.

According to one embodiment, the second material of the second substrate is an elastomer, preferably selected from the group comprising polydimethylsiloxane, polymethyl methacrylate, polyamides such as PA 6-3-T and polytetrafluoroethylene.

Thus, the choice of an elastomer makes it easier to deform the active layer by more than 0.75%, or even more than 1%, without creating defects, because such a choice allows the thickness of the second substrate relative to the active layer to be substantially increased, for example, so that $h_2/h_1 \geq 10^6$, by virtue of the substantially higher flexibility of the second material of the second substrate (low Young's modulus of an elastomer) relative to the first material of the first substrate, for example, $E_2/E_1 \geq 10^{-4}$. Therefore, as was described above, the thickness of the second substrate is a crucial parameter for increasing the torsional moment in step c).

According to one feature, the first material of the active layer is a semiconductor, preferably selected from the group comprising Si, Ge, IV-IV materials such as Si—Ge, III-V materials such as GaN, GaAs, InP, InGaAs and II-VI materials.

Advantageously, the first material of the active layer is a piezoelectric material, preferably selected from the group comprising lead zirconate titanate, ZnO, GaN, AlN, quartz, LiNbO$_3$, LiTaO$_3$, BaTiO$_3$ and tourmaline.

Thus, such a first material allows the problem of buckling of the active layer, when the initial strain state is a relaxed state, and when it is desired to obtain a compressive final strain state, to be overcome. Specifically, if the first material is compressively strained beforehand statically, the first material accepts without breaking mechanical oscillations of an increased amplitude. The effectiveness of the piezoelectric transduction is also improved. Furthermore, the compressive strain with buckling of the active layer again allows the amplitude of the mechanical oscillations and the effectiveness of the piezoelectric transduction to be increased.

According to one embodiment, the first material of the active layer is a polymer, preferably a polymer semiconductor and, even more preferably, an organic polymer semiconductor.

Thus, such a first material is easier to strain than a rigid material because of its lower Young's modulus. Furthermore, relative to a rigid material, a clearly larger thickness of such a first material may be strained.

According to another embodiment, the first material of the active layer is a ferromagnetic material.

Thus, such a first material is particularly suitable for a spintronics application. The modification of the strain state of the active layer enables modification of the hysteresis cycle.

According to another embodiment, the first material of the active layer is a non-linear optical material.

Thus, such a first material may be particularly suitable for generating second harmonics.

According to another embodiment, the first material of the active layer is a pyroelectric material.

According to one method of implementation, the process comprises a step f) consisting in transferring the active layer to a final substrate, then comprises a step g) consisting in removing the second substrate.

Thus, the second substrate forms a temporary substrate employed only for the modification of the strain state. The final substrate is chosen depending on the application envisioned for the active layer.

The present invention also relates to a structure for modifying an initial strain state of what is referred to as an active layer to a final strain state denoted $\epsilon$, the structure comprising:

a substrate; and the active layer surmounting the substrate, the active layer being made of a first material having a Young's modulus denoted $E_1$, the active layer having a thickness denoted $h_1$, the substrate being made of a second material having a Young's modulus denoted $E_2$, the substrate having a thickness denoted $h_2$, the substrate and the active layer having a curved shape of a radius of curvature denoted R, the structure being noteworthy in that the second material of the substrate is a flexible material respecting the relationship $E_2/E_1 < 10^{-2}$, in that the thickness of the substrate respects the relationship $h_2/h_1 \geq 10^4$, and in that the radius of curvature respects the relationship $$R = \frac{h_2}{2\varepsilon}.$$

Thus, as noted above, it has been observed that surprisingly the thickness of the substrate plays a more important role than its stiffness with regard to increasing the torsional moment and with regard to obtaining an active layer having the desired curved shape. It is for this reason that the thickness of the substrate is chosen to respect the relationship $h_2/h_1 \geq 10^4$. The substrate must then permit a preset curvature to be obtained for such a thickness. It is for this reason that the second material is chosen to be a flexible material respecting the relationship $E_2/E_1 < 10^{-2}$. The curvature is preset according to the relationship $$R = \frac{h_2}{2\varepsilon},$$

the final strain state $\epsilon$ being characterized by the desired strain level (and, therefore, the desired deformation).

In one embodiment, the substrate comprises two lateral end portions, and the structure comprises at least one reinforcing member arranged in each lateral end portion, each reinforcing member preferably being needle-shaped.

Thus, edge effects have been observed (illustrated in FIG. 2A), i.e., losses of effectiveness in terms of strain level in the lateral end portions of the active layer. Thus, such a structure allows this problem to be overcome by locally reinforcing the lateral end portions of the substrate. Moreover, a needle shape is particularly suitable for obtaining a mechanical reinforcement while ensuring the second material of the substrate remains highly flexible.

Advantageously, the structure comprises a layer forming a stiffener joined to the substrate.

Thus, the substrate in conjugation with the layer forming a stiffener defines a composite substrate allowing a high strain level to be obtained without creating defects, even when the active layer has a large thickness $h_1$. The layer forming a stiffener acts as a counter plate that allows the deformation of the useful layer to be compensated for.

According to one embodiment, each reinforcing member extends from the layer forming a stiffener.

Thus, it is easy to place the reinforcing members in the second substrate using the layer forming a stiffener.

According to one embodiment, the second material of the substrate is an elastomer, preferably selected from the group comprising polydimethylsiloxane, polymethyl methacrylate, polyamides such as PA 6-3-T and polytetrafluoroethylene.

Thus, the choice of an elastomer makes it easier to deform the active layer by more than 0.75%, or even more than 1%, without creating defects, because such a choice allows the thickness of the substrate relative to the active layer to be substantially increased, for example, so that $h_2/h_1 \geq 10^6$, by virtue of the substantially higher flexibility of the second material of the substrate (low Young's modulus of an elastomer) relative to the first material of the active layer, for example, $E_2/E_1 \leq 10^{-4}$. Therefore, as was described above, the thickness of the substrate is a crucial parameter for increasing the torsional moment so that the active layer has the desired curved shape.

According to one embodiment, the first material of the active layer is a semiconductor, preferably selected from the group comprising Si, Ge, IV-IV materials such as Si—Ge, III-V materials such as GaN, GaAs, InP, InGaAs and II-VI materials.

Advantageously, the first material of the active layer is a piezoelectric material, preferably selected from the group comprising lead zirconate titanate, ZnO, GaN, AlN, quartz, $LiNbO_3$, $LiTaO_3$, $BaTiO_3$ and tourmaline.

Thus, such a first material allows the problem of buckling of the active layer to be overcome, when the initial strain state is a relaxed state and when it is desired to obtain a compressive final strain state. Specifically, if the first material is compressively strained beforehand statically, the first material accepts without breaking mechanical oscillations of an increased amplitude. The effectiveness of the piezoelectric transduction is also improved. Furthermore, the compressive strain with buckling of the active layer again allows the amplitude of the mechanical oscillations and the effectiveness of the piezoelectric transduction to be increased.

According to one embodiment, the first material of the active layer is a polymer, preferably a polymer semiconductor and, even more preferably, an organic polymer semiconductor.

Thus, such a first material is easier to strain than a rigid material because of its lower Young's modulus. Furthermore, relative to a rigid material, a clearly larger thickness of such a first material may be strained.

According to another embodiment, the first material of the active layer is a ferromagnetic material.

Thus, such a first material is particularly suitable for a spintronics application. The modification of the strain state of the active layer enables modification of the hysteresis cycle.

According to another embodiment, the first material of the active layer is a non-linear optical material.

Thus, such a first material may be particularly suitable for generating second harmonics.

According to another embodiment, the first material of the active layer is a pyroelectric material.

BRIEF DESCRIPTION OF THE DRAWINGS

Other features and advantages will become more apparent from the following description of methods of implementing a process according to the disclosure, these methods being given by way of nonlimiting example and with reference to the appended drawings, in which.

DETAILED DESCRIPTION

In the various methods of implementation, the same references will be used for elements that are identical or that have the same function, for the sake of simplification of the description.

The process illustrated in FIGS. 1A to 1G is a process for modifying an initial strain state of an active layer 10 to a final strain state denoted c. By way of nonlimiting example, the initial strain state of the active layer 10 is a relaxed state.

The process comprises a step a) consisting in providing a first substrate 1 comprising the active layer 10 in the initial strain state (illustrated in FIG. 1A), the active layer 10 being made of a first material having a Young's modulus denoted $E_1$, the active layer 10 having a thickness denoted $h_1$. The first material of the active layer 10 may be a semiconductor, preferably selected from the group comprising Si, Ge, IV-IV materials such as Si—Ge, III-V materials such as GaN, GaAs, InP, InGaAs and II-VI materials. By way of nonlimiting example, the thickness of the active layer 10 is between 5 nm and 50 nm and preferably between 5 nm and 35 nm. Moreover, the Young's modulus of silicon is about 160 GPa.

Figure 1A:
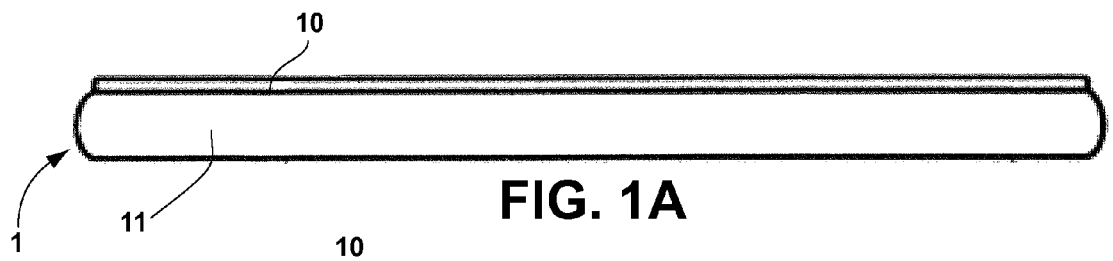
FIGS. 1A to 1G are transverse cross-sectional views illustrating various steps of a first method of implementing a process according to the disclosure.
Figure 1B:
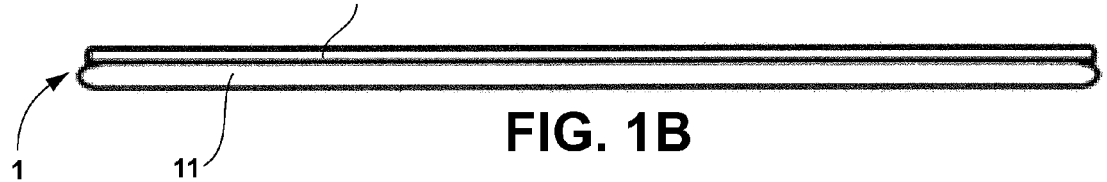
Figure 1C:
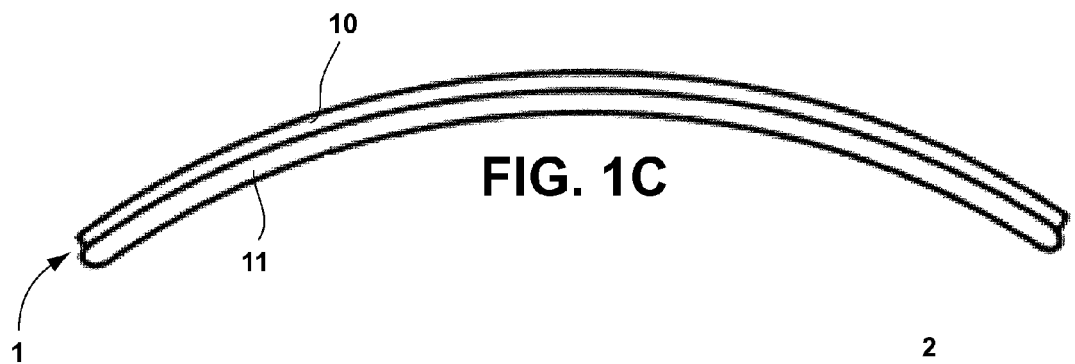
Figure 1D:
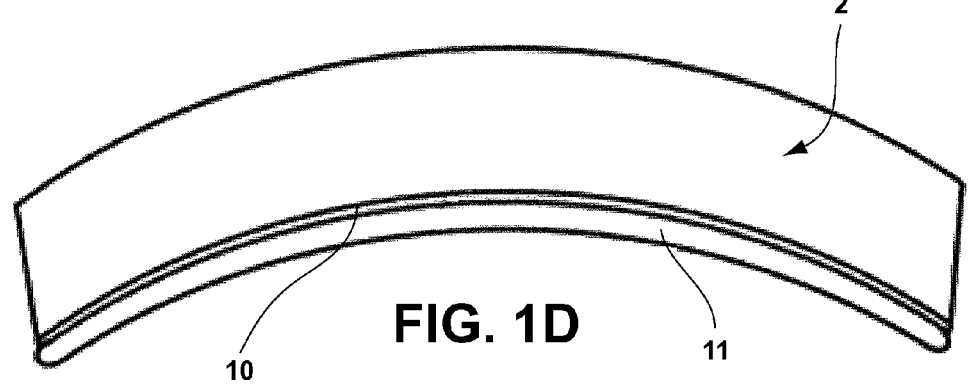

The first substrate 1 comprises a first portion forming the active layer 10 and a second portion 11. The process comprises a step d1) consisting in decreasing the thickness of the second portion 11 of the first substrate 1. More precisely, as illustrated in FIG. 1B, the step d1) is carried out so that the first substrate 1 remains self-supporting. Step d1) may be carried out mechanically, especially by grinding, or even by chemical etching.

The process comprises a step b) consisting in providing a second substrate 2 made of a second material having a Young's modulus denoted $E_2$, the second substrate 2 having a thickness denoted $h_2$, the second substrate 2 having an initial shape at rest. The second material of the second substrate 2 is a flexible material respecting the relationship $E_2/E_1 < 10^{-2}$. The thickness of the second substrate 2 respects the relationship $h_2/h_1 \geq 10^4$. The radius of curvature respects the relationship $$R = \frac{h_2}{2\varepsilon}.$$

More precisely, the second material of the second substrate 2 may be an elastomer, preferably selected from the group comprising polydimethylsiloxane (PDMS), polymethyl methacrylate, polyamides such as PA 6-3-T and polytetrafluoroethylene. Moreover, the Young's modulus of PDMS is about 7.1 MPa. By way of nonlimiting example, the thickness of the second substrate 2 is comprised between 1 cm and 10 cm.

The process comprises a step c) consisting in bending the first substrate 1 (illustrated in FIG. 1C) and the second substrate 2 so that they each have a curved shape of substantially identical radius of curvature. The radius of curvature may be between 0.5 m and 2 m. Step c) may be carried out using a curved cylindrical mold. The active layer 10 then has an intermediate strain state, namely a state of slight tensile strain.

The process comprises a step d) consisting in joining the second substrate 2 to the active layer 10 (illustrated in FIG. 1D) so that the second substrate 2 closely follows the curved shape of the first substrate 1. Step d) may be carried out so as to obtain a direct bond between the second substrate 2 and the active layer 10 using a suitable cleaning agent known to those skilled in the art.

Figure 1E:
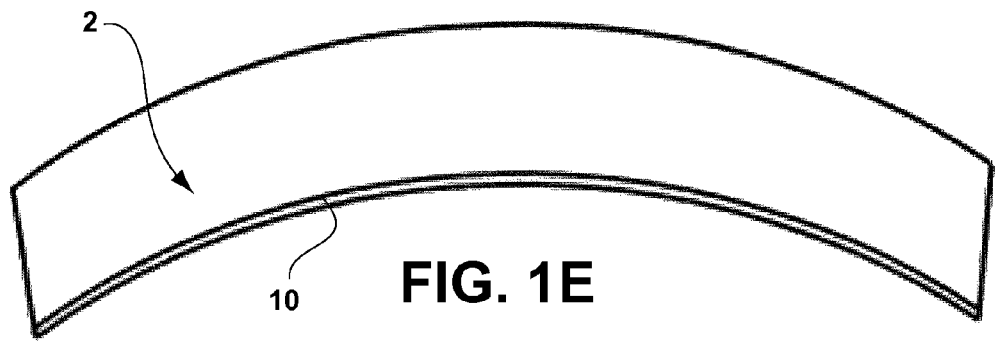
Figure 1F:
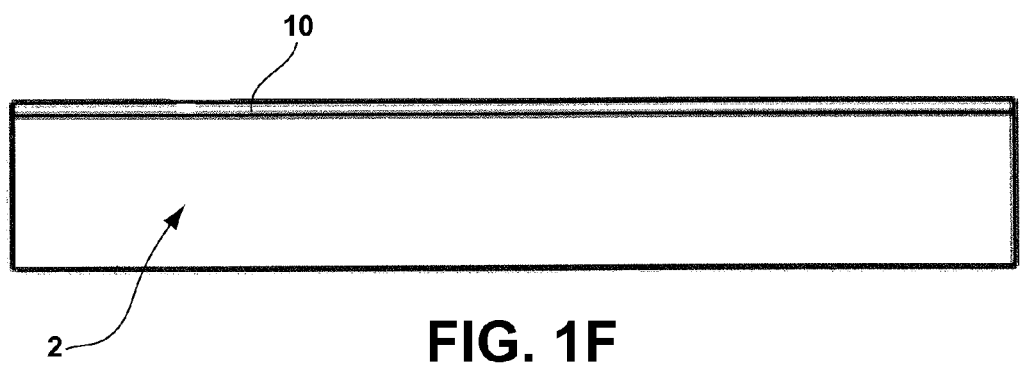

After step d), the second portion 11 of the first substrate 1 is removed (illustrated in FIG. 1E), for example, by etching. Thus, a structure according to the invention is illustrated in FIG. 1E. The structure therefore comprises:
  the second substrate 2; and
  the active layer 10 surmounting the second substrate 2.

The process comprises a step e) consisting in re-establishing the initial at-rest shape of the second substrate 2 (illustrated in FIG. 1F) so that the active layer 10 has the final strain state, namely a state of high tensile strain.

Figure 1G:
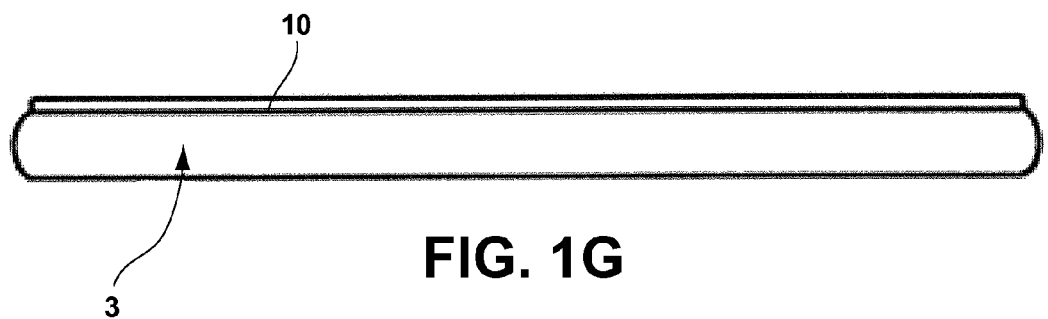

As illustrated in FIG. 1G, the process comprises a step f) consisting in transferring the active layer 10 to a final substrate 3, then comprises a step g) consisting in removing the second substrate 2. Of course, the material from which the final substrate 3 is made must have a suitable Young's modulus so that the strain level obtained in step e) is maintained. Step g) may be a step of delamination.

Figure 2A:
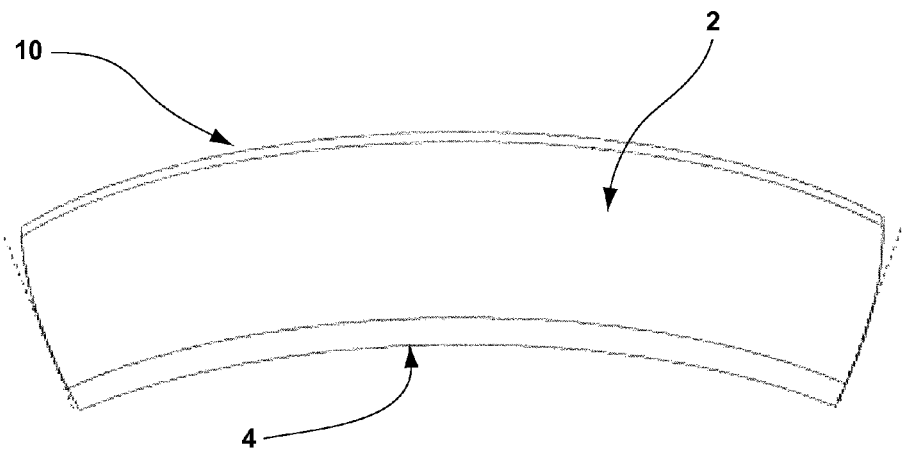
FIGS. 2A and 2B are transverse cross-sectional views illustrating variant implementations of a process according to the disclosure.

In the method of implementation illustrated in FIG. 2A, the process differs from the process illustrated in FIGS. 1A to 1G in that it comprises a step c2) consisting in joining a layer forming a stiffener 4 to the second substrate 2, step c2) being carried out before step c).

Figure 2B:
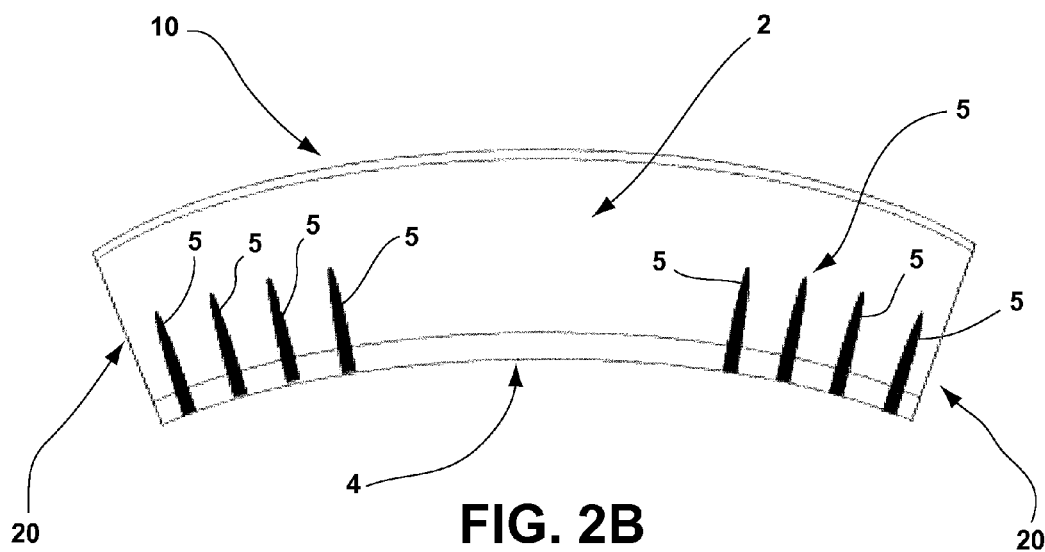

In the method of implementation illustrated in FIG. 2B, the process differs from the process illustrated in FIG. 2A in that the process comprises a step c1) consisting in arranging at least one reinforcing member 5 in each lateral end portion 20 of the second substrate 2, each reinforcing member 5 being needle-shaped. Furthermore, each reinforcing member 5 extends from the layer forming a stiffener 4. Thus, a structure according to the invention is illustrated in FIG. 2B. The structure therefore comprises:

the second substrate 2 comprising two lateral end portions 20;
the active layer 10 surmounting the second substrate 2;
a layer forming a stiffener 4 joined to the substrate 2;
and needle-shaped reinforcing members 5 arranged in each lateral end portion 20, each reinforcing member 5 extending from the layer forming a stiffener 4.

Figure 3:
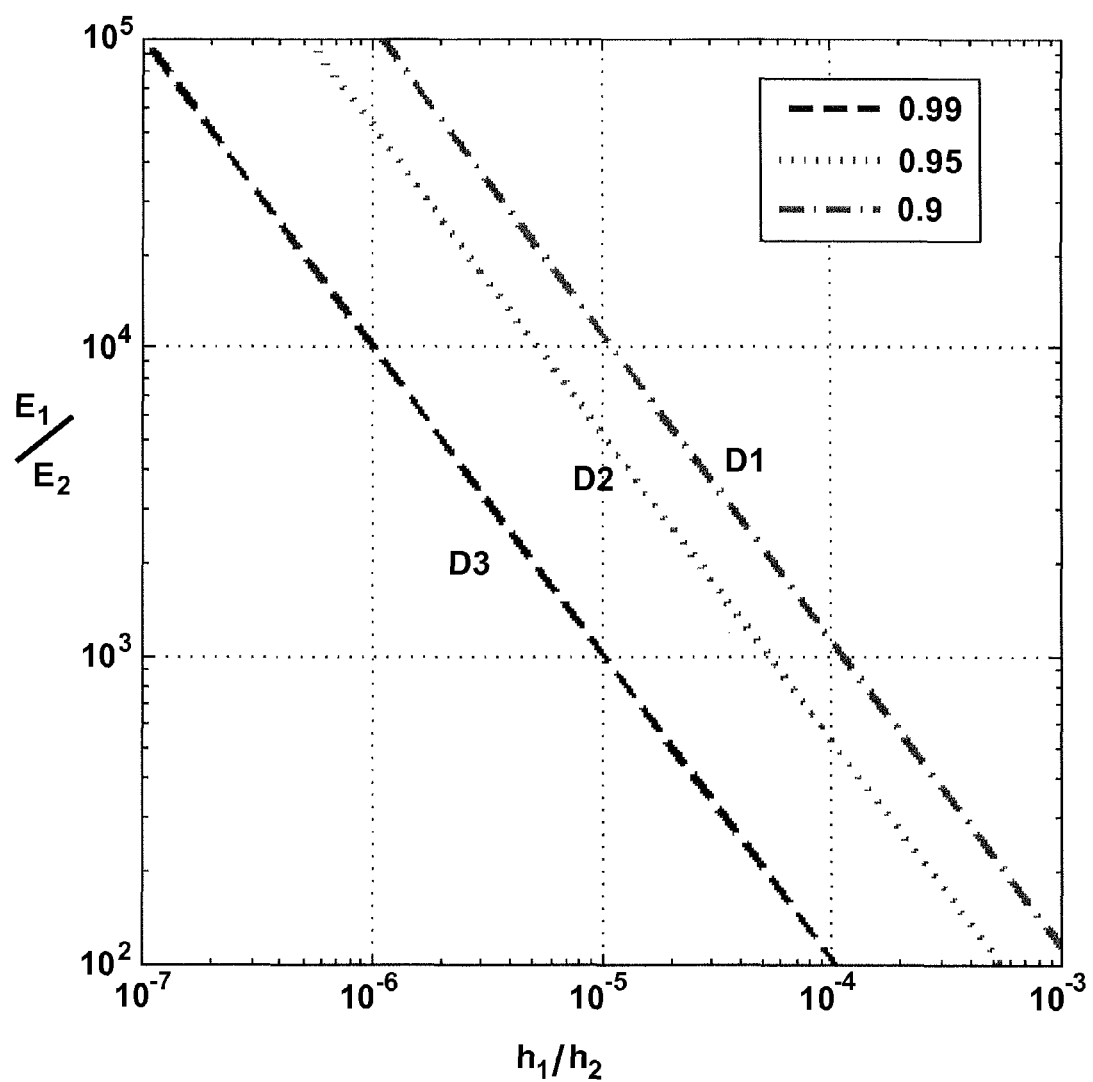
FIG. 3 is a graph in which $h_1/h_2$ is represented on the x-axis and $E_1/E_2$ on the y-axis, illustrating an operating range for implementing a process according to the disclosure.

As regards the graph illustrated in FIG. 3, the model developed in document D1 with the hypotheses $E_2 \ll E_1$ and $h_2 \gg h_1$ leads to the following equations:

$$\varepsilon = \frac{h_2}{2R} F$$

$$F = \frac{1 + 2(h_1/h_2) + E_1/E_2(h_1/h_2)^2}{1 + E_1/E_2(h_1/h_2)}$$

F may be defined as a quality factor that expresses the effectiveness of the strain-inducing operation. The graph illustrated in FIG. 3 shows three straight lines D1, D2 and D3 corresponding to three values of F: 0.9, 0.95 and 0.99, respectively. When F is near 1 (for example, for the straight line D3 corresponding to F=0.99) then $$\varepsilon \approx \frac{h_2}{2R}.$$

Thus, the portion bounded below the straight line D3 corresponding to F=0.99 defines an operating range of the process.

By way of nonlimiting example, the second material of the second substrate 2 may respect the relationship $E_2/E_1 < 10^{-3}$, and the thickness of the second substrate 2 may respect the relationship $h_2/h_1 \geq 10^5$. Likewise, the second material of the second substrate 2 may respect the relationship $E_2/E_1 \leq 10^{-4}$, and the thickness of the second substrate 2 may respect the relationship $h_2/h_1 \geq 10^6$.

Of course, the methods of implementing the disclosure described above are not limiting in nature. Details and improvements may be added thereto in other variant embodiments without, however, departing from the scope of the disclosure.

The invention claimed is:

1. A method for modifying an initial strain state of an active layer to a final strain state denoted $\varepsilon$, the process comprising steps of:

a) providing a first substrate comprising the active layer in the initial strain state, the active layer comprising a first material having a Young's modulus denoted $E_1$, the active layer having a thickness denoted $h_1$;

b) providing a second substrate comprising a flexible second material having a Young's modulus denoted $E_2$, the second substrate having a thickness denoted $h_2$, the second substrate having an initial shape at rest, and selecting the second substrate and the flexible second material such that $E_2/E_1 < 10^{-2}$ and such that $h_2/h_1 \geq 10^4$;

c) bending the first substrate and the second substrate such that they each have a curved shape of substantially identical radius of curvature denoted R, and selecting the radius of curvature such that $$R = \frac{h_2}{2\varepsilon};$$

d) joining the second substrate to the active layer such that the second substrate closely follows the shape of the first substrate; and e) re-establishing the initial at-rest shape of the second substrate such that the active layer has the final strain state.

2. The method according to claim 1, wherein the first substrate comprises a first portion forming the active layer and a second portion, and wherein the process comprises a step d1) comprising decreasing a thickness of the second portion of the first substrate.

3. The method according to claim 2, wherein step d1) is carried out such that the first substrate remains self-supporting, and wherein step d1) is carried out before step c).

4. The method according to claim 2, wherein step d1) is carried out so as to remove substantially an entirety of the second portion of the first substrate and wherein step d1) is carried out after step d) and before step e).

5. The method according to claim 1, wherein the second substrate comprises two lateral end portions, and wherein the process comprises a step c1) comprising arranging at least one reinforcing member in each lateral end portion.

6. The method according to claim 1, further comprising a step c2) comprising joining a layer comprising a stiffener to the second substrate, and wherein step c2) is carried out before step c).

7. The method according to claim 5, further comprising a step c2) comprising joining a layer comprising a stiffener to the second substrate, where step c2) is carried out before step c), and wherein each reinforcing member extends from the layer comprising the stiffener.

8. The method according to claim 1, further comprising selecting the second substrate and the flexible second material such that $E_2/E_1 \leq 10^{-3}$ and such that $h_2/h_1 \geq 10^5$.

9. The method according to claim 1, further comprising selecting the second substrate and the flexible second material such that $E_2/E_1 \leq 10^{-4}$ and such that $h_2/h_1 \geq 10^6$.

10. The method according to claim 1, wherein the thickness of the active layer is between 5 nm and 50 nm, and wherein the thickness of the second substrate is between 1 cm and 10 cm.

11. The method according to claim 1, wherein the radius of curvature is between 0.5 m and 2 m in absolute value.

12. The method according to claim 1, further comprising selecting the flexible second material of the second substrate to comprise an elastomer selected from the group consisting of polydimethylsiloxane, polymethyl methacrylate, and a polyamide.

13. The method according to claim 1, further comprising selecting the first material of the active layer to comprise a semiconductor selected from the group consisting of Si, Ge, a IV-IV material, a III-V material, and a II-VI material.

14. The method according to claim 1, further comprising selecting the first material of the active layer to comprise a piezoelectric material selected from the group consisting of lead zirconate titanate, ZnO, GaN, AlN, quartz, $LiNbO_3$, $LiTaO_3$, $BaTiO_3$ and tourmaline.

15. The method according to claim 1, further comprising a step f) comprising transferring the active layer to a final substrate, and a step g) comprising removing the second substrate after performing the transferring the active layer to the final substrate.

16. A structure for modifying an initial strain state of an active layer to a final strain state denoted $\epsilon$, the structure comprising:
a substrate; and
the active layer mounted on the substrate, the active layer comprising a first material having a Young's modulus denoted $E_1$, the active layer having a thickness denoted $h_1$, the substrate comprising a second material having a Young's modulus denoted $E_2$, the substrate having a thickness denoted $h_2$, the substrate and the active layer having a curved shape of a radius of curvature denoted R, wherein the second material of the substrate comprises a flexible material respecting the relationship $E_2/E_1 < 10^{-2}$, wherein the thickness of the substrate respects the relationship $h_2/h_1 \geq 10^4$, and wherein the radius of curvature respects the relationship $$R = \frac{h_2}{2\varepsilon}.$$

17. The structure according to claim 16, wherein the substrate comprises two lateral end portions, and wherein the structure comprises at least one reinforcing member in each lateral end portion.

18. The structure according to claim 16, wherein the structure comprises a layer comprising a stiffener joined to the substrate.

19. The structure according to claim 17, wherein the structure comprises a layer comprising a stiffener joined to the substrate, and wherein each reinforcing member extends from the layer comprising the stiffener.

20. The structure according to claim 16, wherein the second material of the substrate comprises an elastomer selected from the group consisting of polydimethylsiloxane, polymethyl methacrylate, and a polyamide.

21. The structure according to claim 16, wherein the first material of the active layer comprises a semiconductor selected from the group consisting of Si, Ge, IV-IV material, a III-V material, and II-VI material.

22. The structure according to claim 16, wherein the first material of the active layer comprises a piezoelectric material selected from the group consisting of lead zirconate titanate, ZnO, GaN, AlN, quartz, $LiNbO_3$, $LiTaO_3$, $BaTiO_3$ and tourmaline.

* * * * *

UNITED STATES PATENT AND TRADEMARK OFFICE
CERTIFICATE OF CORRECTION

PATENT NO. : 9,240,343 B2
APPLICATION NO. : 14/438175
DATED : January 19, 2016
INVENTOR(S) : Yves-Matthieu Le Vaillant and Etienne Navarro Page 1 of 1

It is certified that error appears in the above-identified patent and that said Letters Patent is hereby corrected as shown below:

In the specification:
- COLUMN 4, LINE 63, change "GaN, AlN, quartz," to --GaN, AlN, quartz,--
- COLUMN 6, LINE 59, change "GaN, AlN, quartz," to --GaN, AlN, quartz,--
- COLUMN 7, LINE 50, change "denoted c." to --denoted ε.--

In the claims:
- CLAIM 4, COLUMN 10, LINE 22, change "first substrate and" to --first substrate, and--
- CLAIM 4, COLUMN 10, LINE 23, change "step d)and" to --step d) and--
- CLAIM 14, COLUMN 10, LINE 61, change "GaN, AlN, quartz," to --GaN, AlN, quartz,--
- CLAIM 21, COLUMN 12, LINE 16, change "Si, Ge, IV-IV" to --Si, Ge, a IV-IV--
- CLAIM 21, COLUMN 12, LINE 17, change "material, and II-VI" to --material, and a II-VI--
- CLAIM 22, COLUMN 12, LINE 21, change "GaN, AlN, quartz," to --GaN, AlN, quartz,--

Signed and Sealed this
Second Day of August, 2016

Michelle K. Lee
*Director of the United States Patent and Trademark Office*